(12) United States Patent
Blatchford

(10) Patent No.: US 8,707,223 B2
(45) Date of Patent: Apr. 22, 2014

(54) METHOD FOR ENSURING DPT COMPLIANCE WITH AUTOROUTED METAL LAYERS

(71) Applicant: Texas Instruments Incorporated, Dallas, TX (US)

(72) Inventor: James Walter Blatchford, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/622,937

(22) Filed: Sep. 19, 2012

(65) Prior Publication Data

US 2013/0074028 A1    Mar. 21, 2013

Related U.S. Application Data

(60) Provisional application No. 61/536,312, filed on Sep. 19, 2011.

(51) Int. Cl.
*G06F 17/50*     (2006.01)

(52) U.S. Cl.
USPC .......................................................... 716/55

(58) Field of Classification Search
USPC .......................................................... 716/55
See application file for complete search history.

(56) References Cited

U.S. PATENT DOCUMENTS

| 8,402,396 B2 * | 3/2013 | Kahng et al. ..................... 716/52 |
| 8,473,874 B1 * | 6/2013 | Sharma et al. ................... 716/52 |
| 2011/0119648 A1 * | 5/2011 | Chen et al. ..................... 716/126 |

* cited by examiner

*Primary Examiner* — Jack Chiang
*Assistant Examiner* — Brandon Bowers
(74) *Attorney, Agent, or Firm* — Alan A. R. Cooper; W. James Brady, III; Frederick J. Telecky, Jr.

(57) ABSTRACT

A method of generating an integrated circuit with a DPT compatible interconnect pattern using a reduced DPT compatible design rule set and color covers. A method of operating a computer to generate an integrated circuit with a DPT compatible interconnect pattern using a reduced DPT compatible design rule set and using color covers. A reduced DPT compatible design rule set.

12 Claims, 6 Drawing Sheets

METHOD FOR ENSURING DPT COMPLIANCE WITH AUTOROUTED METAL LAYERS

This application claims the benefit of priority and incorporates by reference U.S. Provisional Application 61/536,312, filed Sep. 19, 2011.

The following co-pending patent applications are related and hereby incorporated by reference: U.S. patent application Ser. No. 13/622,935, filed Sep. 19, 2012, and U.S. patent application Ser. No. 13/622,949, filed Sep. 19, 2012.

FIELD OF THE INVENTION

This invention relates to the field of integrated circuits. More particularly, this invention relates to double patterning photolithograph processes for forming integrated circuits.

BACKGROUND

Integrated circuits may be formed using photolithography processes with illumination sources having wavelengths more than twice a desired pitch of metal interconnect lines in the integrated circuits. Attaining desired tradeoffs between fabrication costs and fabrication yield may be difficult. For example, standard single photoresist patterns begin to blur at about the 45 nm feature size and 100 nm pitch (feature size plus space between features) when printing with 193 nm wavelength light.

Double patterning technology (DPT), illustrated in FIG. 1, may be used to print patterns with a pitch that is tighter than can be printed with a single exposure. In DPT technology approximately one half the geometries of the interconnect pattern 20 are placed on a first double patterning photo mask 22 and the remainder of the geometries are placed on a second double patterning photo mask 24. For example, a pattern with 100 nm pitch which prints blurred when all geometries are placed on a single photo mask may be decomposed into two DPT photo masks each with a 200 nm pitch which print without blurring. Geometries placed on the first DPT photo mask are described as having a first color and geometries placed on the second DPT photo mask are described as having a second color.

As shown in FIG. 2A in DPT the same color interconnect geometry design rule space 30 in the horizontal direction is larger than the different color interconnect geometry design rule space 32. Similarly, in FIG. 2B the same color interconnect geometry design rule space 34 in the vertical direction is larger than the different color interconnect geometry design rule space 36.

As shown in FIGS. 3A and 3B, unrestricted routing layout may result in color conflicts which violate DPT design rules. For example, in FIG. 3A vertical space 50 between same color preferred direction geometries 46 and 48 violates the vertical same color interconnect geometry design rule space 34. Similarly, in FIG. 3B, vertical space 56 between legs 54 and 52 violates the vertical same color design rule space 34. These are but two illustrative examples of conflicts that may occur with unrestricted layout. Many more may be found integrated circuit interconnect patterns. Resolving these conflicts to render a pattern DPT compatible may be computationally intensive and may also require significant relayout of the pattern. Both can significantly increase cost.

In order to draw the geometries on a single pattern that ensures the geometries are DPT compatible and may be decomposed into two DPT photo masks which each have a relaxed pitch, may be computationally intensive. The DPT layout splitting method is analogous to a two coloring problem for pattern splitting graph theory. The layout geometry and minimum space are similar to the vertex and edge of the graphs respectively. Two adjacent vertices connected with an edge should be assigned different colors. Only two "color types" can be assigned. Each pattern on the layer is assigned a first or second "color". The patterns of the first color are formed on a first mask, and the patterns of the second color are formed on a second mask. A graph is 2-colorable only if after decomposition each mask contains no geometries of the same color that violate DPT design rules.

SUMMARY

A method of generating an integrated circuit with a DPT compatible interconnect pattern using a reduced DPT compatible design rule set and color covers. A method of operating a computer to generate an integrated circuit with a DPT compatible interconnect pattern using a reduced DPT compatible design rule set and using color covers. A reduced DPT compatible design rule set.

DETAILED DESCRIPTION OF EXAMPLE EMBODIMENTS

Methods that ensure an integrated circuit interconnect layout is double pattern technology (DPT) compatible are often computationally intensive and may require significant relayout to resolve color conflicts. Techniques that are not computationally intensive usually result in significantly larger area which increases cost.

The embodiments described below present methods to ensure DPT compatible interconnection patterns in an integrated circuit without intensive computation and with reduced pattern area.

In an embodiment DPT compatible method a relatively simple reduced set of DPT compatible interconnect design rules (DR) may be used by designers to draw interconnect manually or may be input into an electronic design automation (EDA) tool such as "IC COMPILER™" sold by Synopsis, Inc. of Mountain View, Calif. which may include a router such as "ZROUTE™", also sold by Synopsis. Other EDA tools may also be used, such as "VIRTUOSO" custom design platform, or the Cadence "ENCOUNTER" digital IC design platform along with the "VIRTUOSO" chip assembly router all sold by Cadence Design Systems, Inc., of San Jose, Calif. The EDA routing tool is special purpose computer software program that may be loaded onto a general purpose processer and with design rule input data and net list data, perform routing of an integrated circuit and generate an interconnect pattern.

Figure 1:
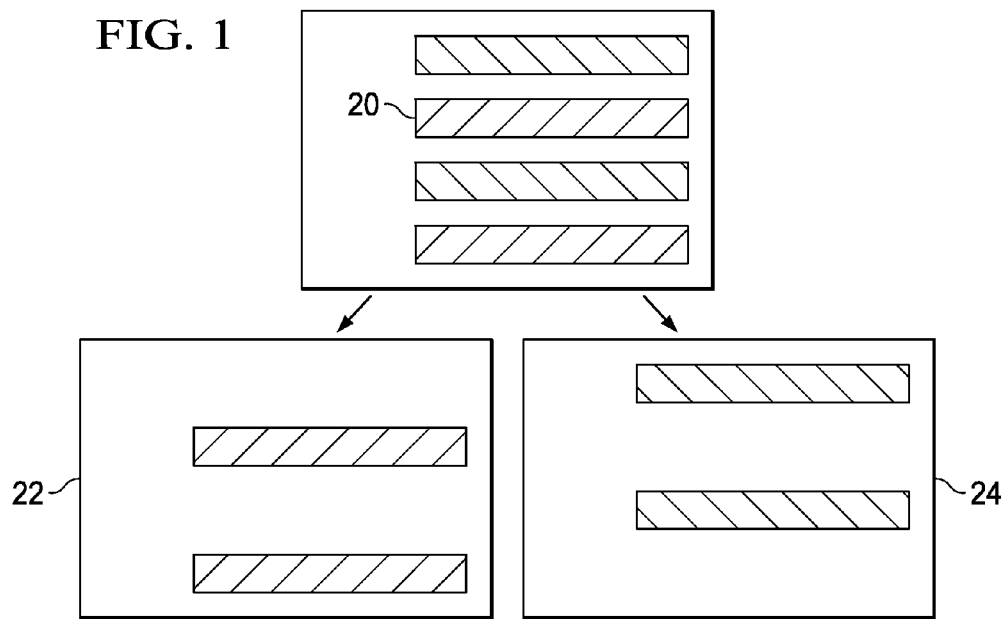
FIG. 1 is an example of a DPT patterns for an interconnect level.

A relatively simple set of embodiment DPT compatible interconnect design rules hereafter referred to as "reduced DPT interconnect design rules" which ensures an interconnect pattern is DPT compatible are listed in TABLE 1 and illustrated in FIGS. 1 and 2. These rules may be used to manually layout an interconnect pattern and may be implemented in software to automatically layout interconnect patterns.

Reduced DPT compatible interconnect design rule 1 in Table 1 defines a preferred routing direction where the interconnect leads alternate color. For purposes of illustration the preferred direction is horizontal as shown in FIG. 1. As shown in FIG. 1 the minimum pitch interconnect routing leads in the non preferred direction alternate in color. The alternating color enables a smaller different color interconnect geometry space design rule to be used to enable a smaller routing pitch. The preferred direction may be vertical for one level of interconnect and horizontal for another level of interconnect.

TABLE 1

1. Preferred routing direction with alternating color minimum pitch routing in the nonpreferred direction.
2. Routing ends are allowed only in the preferred direction
3. Preferred direction and non preferred minimum design rule space for same color routing geometries is greater than about 2 times the minimum width of geometry immediately adjacent.
4. Preferred direction minimum design rule space for different color routing geometries is less than about 2 times the minimum width of the geometry immediately adjacent.
5. Geometry and space design rules are larger for routing in the non preferred direction than for routing in the preferred direction.

Reduced DPT compatible interconnect design rule 2 in Table 1 states that routing ends are allowed only in the preferred direction. As shown in FIG. 1, FIG. 2A-2C, and FIG. 3A-3B routing ends are only in the preferred horizontal direction.

Figure 2A:
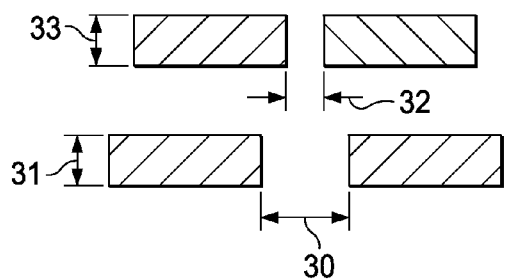
FIGS. 2A-2C illustrate preferred direction vertical and horizontal space design rules for same color and for different color geometries and also preferred direction and non preferred direction design rules.
Figure 2B:
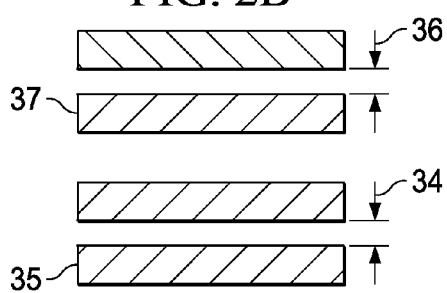

Reduced DPT compatible interconnect design rule 3 in Table 1 states that the minimum design rule space between geometries of the same color is greater than about 2 times the minimum width of the geometry width directly adjacent. This is illustrated in FIGS. 2A and 2B. In FIG. 2A the preferred direction horizontal design rule space 30 between geometries of the same color is greater than about 2 times the width 31 of the interconnect geometry directly adjacent. In FIG. 2B the non preferred direction vertical design rule space 34 between geometries of the same color is at least 2 times larger than the width of the adjacent interconnect geometry 35.

Reduced DPT compatible interconnect design rule 4 in Table 1 states that the minimum design rule space between geometries of different color is less than about 2 times the width of the adjacent interconnect geometry. This is illustrated in FIG. 2A. In FIG. 2A the preferred direction horizontal design rule space 32 between geometries of the same color is less than about 2 times the minimum geometry width 33 of the adjacent interconnect geometry 33. In FIG. 2B the non-preferred direction vertical design rule space 36 between geometries of different color is less than about 2 times the minimum geometry width of the adjacent interconnect geometry 37.

Figure 2C:
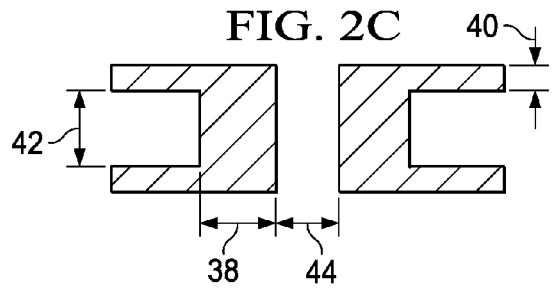
Figure 3A:
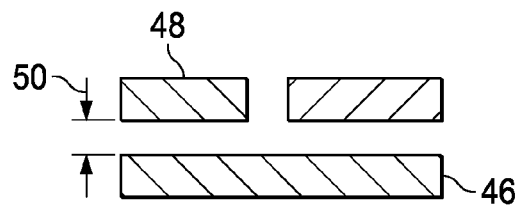
FIGS. 3A and 3B illustrates color conflicts that may occur in interconnect pattern levels that are not DPT compatible.
Figure 3B:
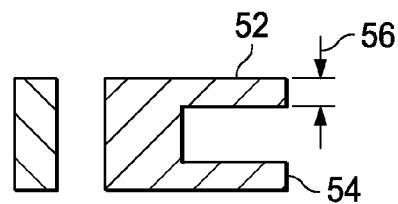

Reduced DPT compatible interconnect design rule 5 in Table 1 states that interconnect geometry widths and spaces in the non preferred direction are larger than the interconnect geometry widths and spaces in the preferred direction. This is illustrated in FIG. 2C. The same color non preferred direction vertical geometry width design rule 38 is larger than the same color preferred direction horizontal geometry width 40. Likewise the space 44 between same color geometries in the non preferred direction is larger than the space 42 between same color geometries in the preferred direction.

A router with the embodiment deduced DPT compatible interconnect design rule set may generate DPT compatible interconnect patterning levels without extensive computation and without requiring additional layout to ensure DPT compatibility.

A repetitive pattern may occur thousands or even millions of times when a subcircuit such as a memory cell or standard cell from a cell library is placed in an integrated circuit. In some instances the same color space DPT compatible interconnect design rule may limit the area of an integrated circuit in the preferred direction. This is especially problematic when the limiting design rule space occurs thousands or millions of times. A method in which an embodiment color cover is drawn over a repetitive interconnect geometry to change the color of the underlying interconnect geometry may be used to reduce the area of the integrated circuit. Color cover design rules may be added to the reduced DPT compatible design rule set during generation of the DPT interconnect patterns to form interconnection patterns with reduced area. Color cover design rules may include such rules as color cover preferred and nonpreferred direction length and width, color cover minimum area, color cover minimum spacing, color cover overlap of underlying geometry, and color cover spacing to interconnect geometry. Examples illustrating the embodiment color cover method to reduce area are illustrated in FIG. 4 through FIG. 9.

Figure 4A:
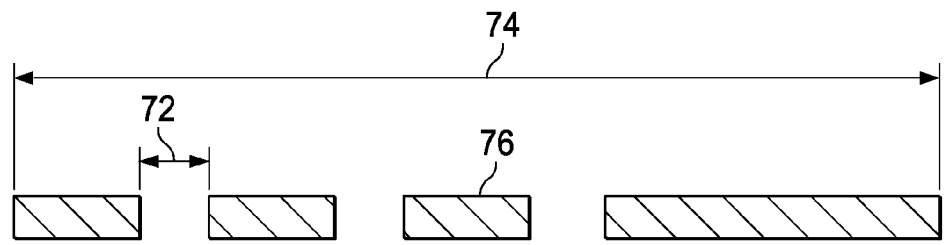
FIG. 4A-4C illustrates an embodiment color cover methodology according to principles of the invention.

A repetitive pattern such as is shown in FIG. 4A may occur in an interconnect pattern level of an integrated circuit in the preferred direction where horizontal direction space 72 obeys the preferred direction same color interconnect geometry design rule 30 (FIG. 2A). In some instances the horizontal space 72 may limit the horizontal length 74 of the repetitive pattern and thereby limit the area of an integrated circuit.

Figure 4B:
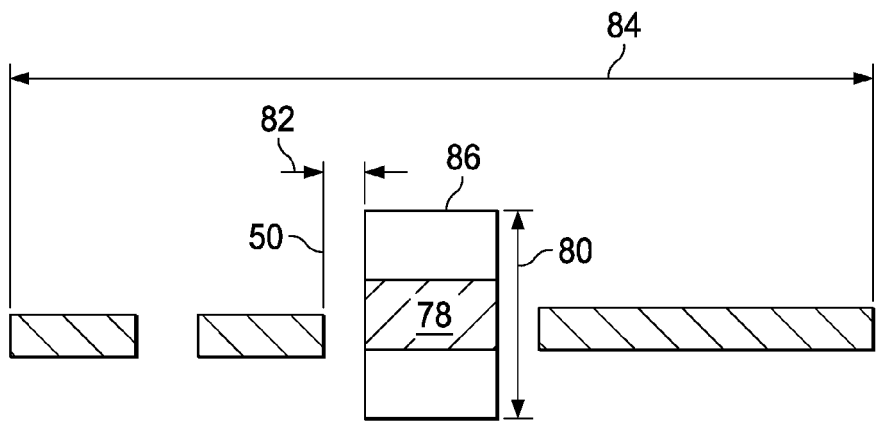

As shown in FIG. 4B an embodiment color cover, 86 may be drawn over one of the geometries 78 to change the color of the underlying geometry. The different color geometry enables the smaller different color design rule space 82 to be used. This may significantly reduce the horizontal length 84 in the preferred direction as may be seen by comparing the length 74 in FIG. 4A without the color cover to the length 84 in FIG. 4B with the color cover. The area savings increases with multiple placements of the repetitive pattern. When the repetitive pattern occurs millions of times in an integrated circuit the area savings may be huge.

The width 80 of the color cover 86 in the non preferred direction is sufficiently large to prevent a same color geometry from being drawn inadjacent interconnect track 88 or adjacent interconnect track 90. This ensures that any geometry that is drawn either above or below will be at least the non preferred direction same color interconnect geometry design rule space away from the geometry 78 underlying the color cover 86.

Figure 4C:
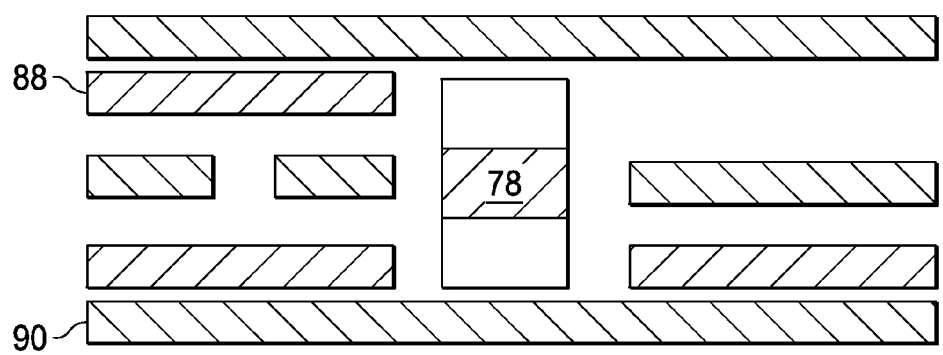

A DPT compatible autorouter which may utilize the reduced set of interconnect design rule in Table 1 may be used to place and route the remaining interconnect geometries required to complete routing of the interconnect layer. An example of a pattern that may be autorouted around the repetitive geometry in FIG. 4B is illustrated in FIG. 4C. Interconnect geometries in adjacent interconnect tracks 88 and 90 are prevented from being drawn either above or below the covered geometry 78 by the color cover 86. The routing may be drawn manually or may be drawn using autorouter software.

The metal1 and metal2 interconnect pattern levels of a subcircuit such as standard cell or a memory cell are used to illustrate another use of embodiment color covers in FIG. 5 through FIG. 9. Standard cells and memory cells may be placed thousands or millions of times in an integrated circuit. Reducing the area may result in a significant area savings for an interconnect pattern and for an integrated circuit chip.

Figure 5A:
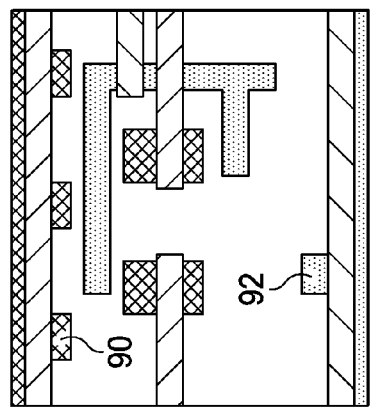
FIGS. 5A-5C, FIG. 6A-6C, FIG. 7, FIG. 8, and FIG. 9 illustrates embodiment color cover methodology for a repetitively placed subcircuit according to principles of the invention.
Figure 5B:
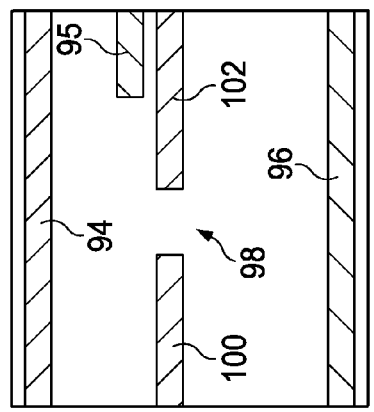
Figure 5C:
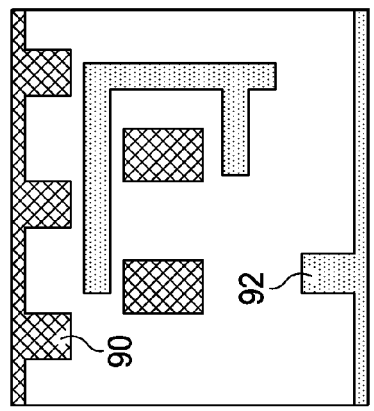

The metal 1 and metal 2 interconnect patterns of a cell in FIG. 5A are shown in FIGS. 5C (metal-1) and 5B (metal-2) respectively. The metal 1 pattern in FIG. 5C is DPT compatible consisting of a first color pattern 90 and a second color pattern 92. The metal2 pattern in FIG. 5B is also a DPT compatible two color pattern. The same color interconnect geometry design rule space 98 between metal 2 geometries 100 and 102 in the preferred direction in the metal 2 pattern 94 may limit the horizontal dimension of the cell in FIG. 5A.

Figure 6A:
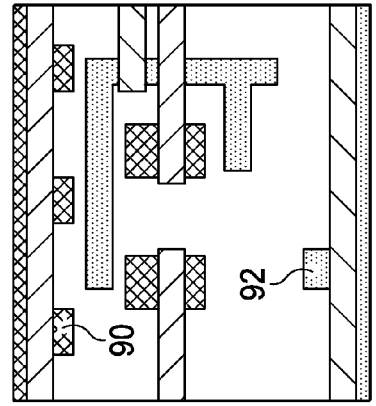
Figure 6B:
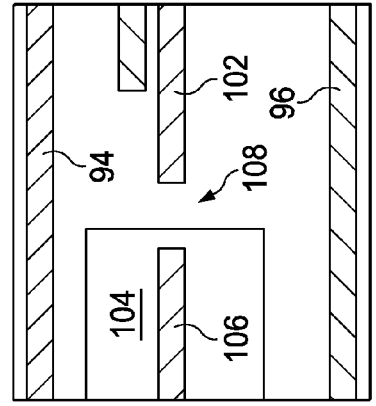
Figure 6C:
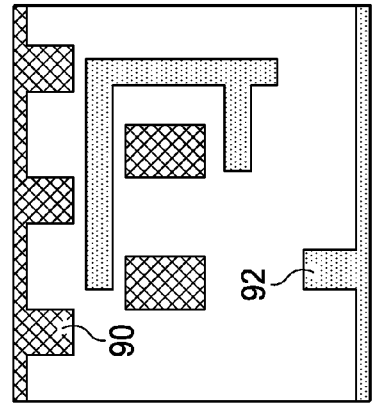

As shown in FIGS. 6A-6C an embodiment color cover 104 may be drawn over metal 2 geometry 106 to change its color enabling the smaller different color interconnect geometry design rule space 108 to be used between metal-2 geometries 102 and 106. The preferred direction horizontal dimension of standard cell in FIG. 6A with different color geometry design rule space 108 is significantly less than the standard cell in FIG. 5A with same color geometry design rule space 98.

Figure 7:
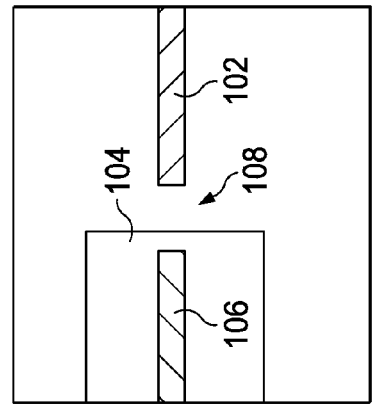

Alternatively as shown in FIG. 7, a designer may manually draw in embodiment color cover 104 and different color interconnect geometry design rule space 108 and use a DPT compliant autorouter to draw in the remaining interconnect geometries such as power rails 94 and 96 and interconnect geometries interior to the cell such as 95.

Figure 8:
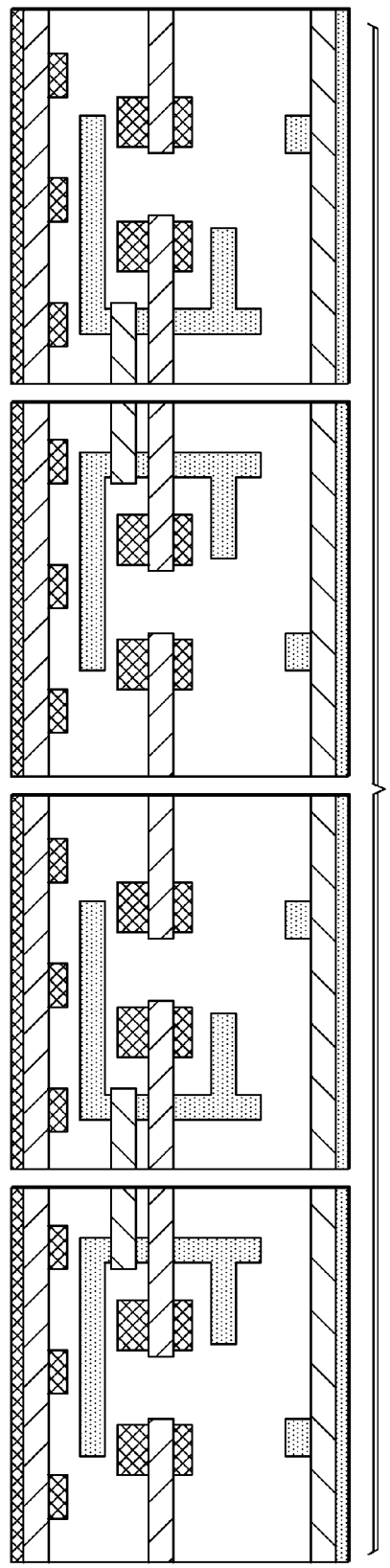
Figure 9:
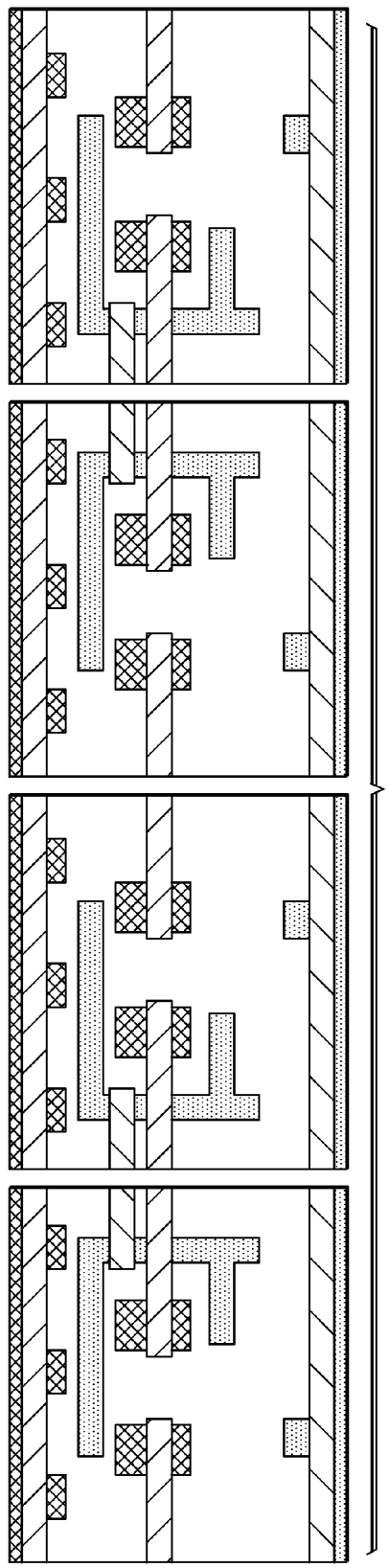

FIG. 8 shows four placements of the original sized cell in FIG. 5A. Alternating placements are mirror images. FIG. 9 shows placements of the reduced sized cell in FIG. 6A. Comparing the area of the layout in FIG. 9 to the area of the layout in FIG. 8 reveals considerable area saving.

Figure 10:
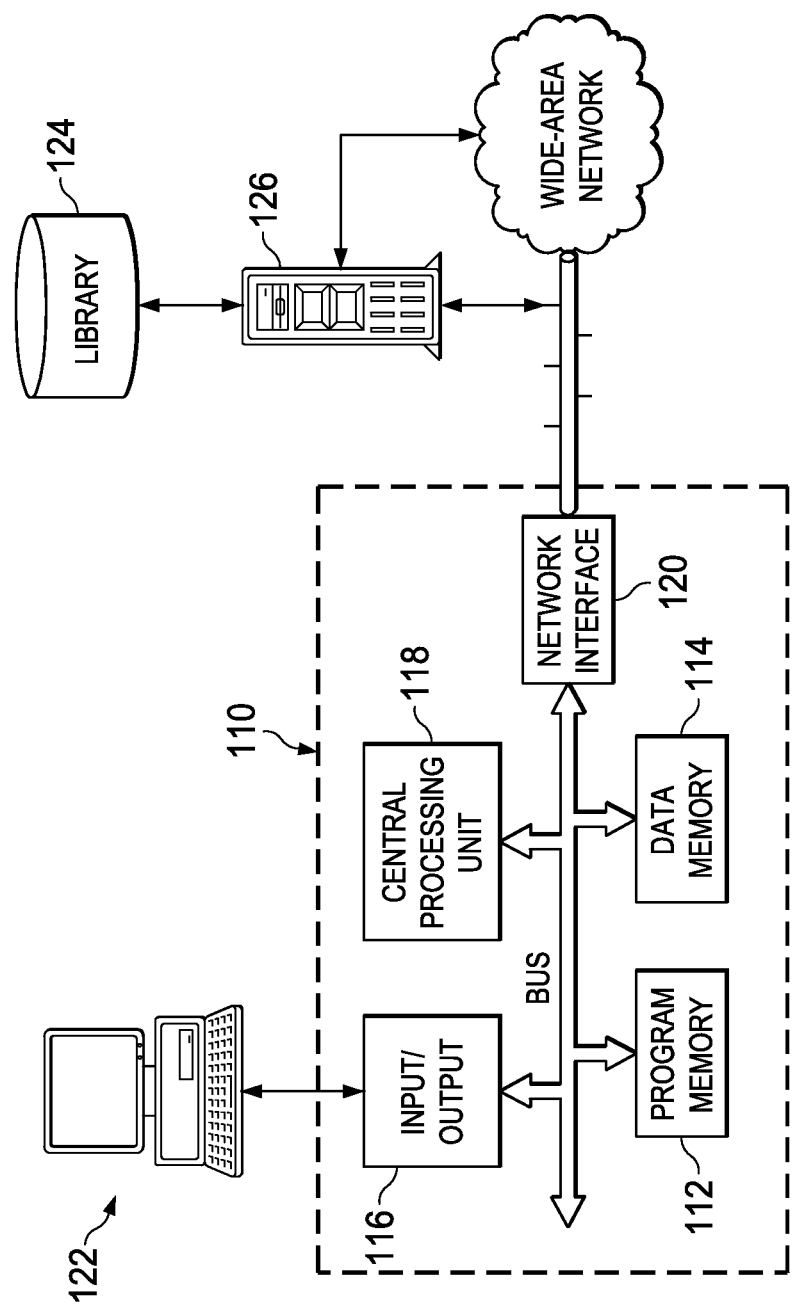
FIG. 10 is an electrical diagram, in schematic form, illustrating a computer system for generating DPT compatible interconnect patterns in an integrated circuit according to principles of this invention.

FIG. 10 illustrates the construction of a system used to perform routing of integrated circuits and to generate integrated circuit interconnection patterns which are DPT compatible according to an embodiment of the invention. In this example, the DPT compatible interconnect pattern generation system is as realized by way of a computer system including workstation 110 connected to server 126 by way of a network through network interface 120. Of course, the particular architecture and construction of a computer system useful in connection with this invention can vary widely. For example, the DPT compatible routing system may be realized by a single physical computer, such as a conventional workstation or personal computer, or alternatively may be a computer system implemented in a distributed manner over multiple physical computers. Accordingly, the generalized architecture illustrated in FIG. 10 is provided by way of example only.

As shown in FIG. 10, workstation 110 includes central processing unit (CPU) 110, coupled to the system bus BUS. Also coupled to system bus BUS is input/output interface 116 which refers to those interface resources by way of which peripheral functions 122 (e.g., keyboard, mouse, display, etc.) communicate with the other constituents of workstation 110. CPU 118 refers to the data processing capability of workstation 110, and as such may be implemented by one or more CPU cores or co-processing circuitry. The particular construction and capability of central processing unit 118 is selected according to the application needs of workstation 110. In the architecture of layout modification system according to this example, program memory 112 and data memory 114 are coupled to the system bus BUS. The workstation 110 and server 122 may also be coupled to a library 124 which may store programs, data, and integrated circuit net lists and layout patterns such as interconnect layout patterns.

Figure 11:
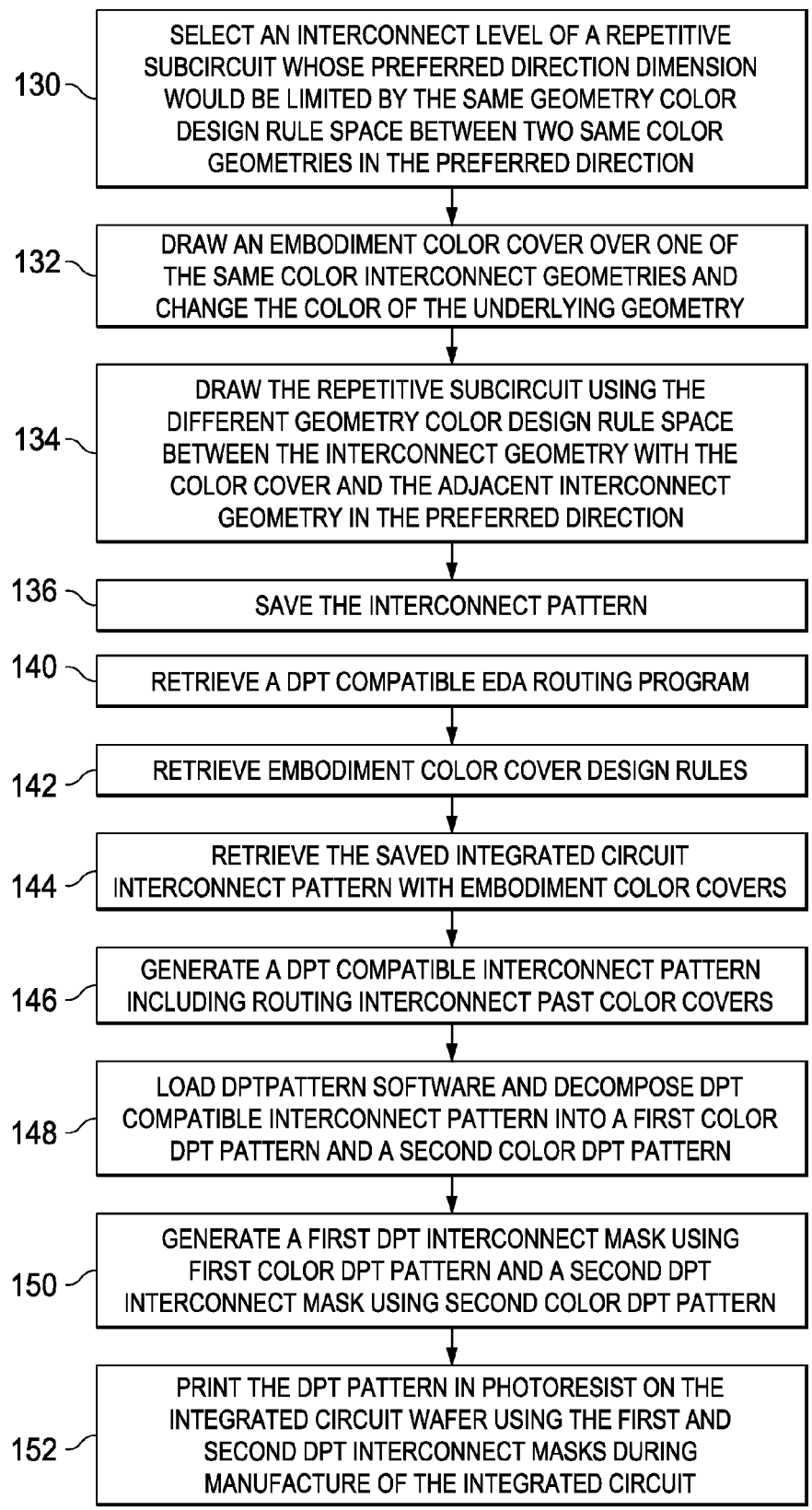
FIG. 11 is a flow diagram illustrating the method for generating DPT compatible interconnect patterns and color cover methodology to form an integrated circuit according to principles of this invention.

FIG. 11 is a process flow diagram illustrating a method for generating a DPT compatible interconnect pattern according to embodiments. In step 130 the interconnect pattern of a repetitive subcircuit whose preferred direction dimension would be limited by a same color interconnect geometry space design rule is selected. This may be repetitive interconnect geometries such as is shown in FIG. 4A and FIG. 5B.

In step 132 a color cover is drawn over one of the interconnect geometries to change its color. The change in color of the underlying interconnect geometry enables the smaller different color interconnect geometry design rule space to be used between the geometry with the color cover and an adjacent interconnect geometry in the preferred direction.

In step 134 the repetitive subcircuit is drawn using the different color design rule space made possible by the embodiment color cover and is saved to a server or other storage medium in step 136.

In step 140, an EDA routing program such as "IC COMPILER"™ sold by Synopsis, Inc. of Mountain View, Calif. or "VIRTUOSO" chip assembly router sold by Cadence Design Systems, Inc., of San Jose, Calif. is loaded into a workstation 110 (FIG. 10). An operator may then input using an input device 122 such as a keyboard the name of the integrated circuit design, the target interconnect level, and the paths to the required files such as the integrated circuit net list file, the reduced DPT compatible interconnect design rules, and the interconnect layer saved in step 136.

In step 142 color cover design rules may be read into the workstation 110 and utilized by the EDA program to enable autorouting around the color covers.

In step 144 the DPT compatible EDA program generates a DPT compatible interconnect pattern.

In step 146 a DPT pattern decomposition software program is loaded into the workstation 110 and used to decompose the auto routed metal into two patterns after place-and-route is complete. The program also assigns colors to predrawn interconnect geometries from steps 132 and 134. The DPT compatible EDA routing program may be removed from workstation 110 prior to loading the DPT pattern decomposition software program.

Referring now to step 148 a first DPT interconnect photomask is generated using first color DPT pattern and a second DPT interconnect photomask is generated using the second color DPT pattern.

In step 150, the two DPT interconnect photomasks made in step 148 may be used to print an interconnect pattern in photoresist during the manufacture of the integrated circuit.

In integrated circuits, the first level of interconnect, metal-1, typically is used to route signals locally. A majority or all the geometries in this level may be laid out manually by the designer. The designer may manually add color covers to reduce the preferred direction length of repetitive geometries. Metal-1 may be drawn manually using the embodiment reduced DPT compatible interconnect geometry design rules in Table 1 or may be drawn using software which implements the embodiment reduced DPT compatible interconnect geometry design rules.

The second level of interconnect, metal-2, typically routes signals both locally and non locally. Designers may choose to manually draw preferred direction metal-2 geometries and add embodiment color to reduce the length of the integrated circuit in the preferred direction. A DPT compatible EDA with color cover design rules may be utilized to autoroute the rest of the DPT compatible interconnect geometries.

Typically interconnect levels three and above that require DPT may be drawn using DPT compatible software.

Those skilled in the art to which this invention relates will appreciate that many other embodiments and variations are possible within the scope of the claimed invention.

What is claimed is:

1. A process of forming an integrated circuit, comprising the steps:
    defining a preferred direction for an interconnect level;
    drawing a first interconnect geometry and second interconnect geometry separated in said preferred direction by a same color interconnect geometry design rule space;
    drawing a third interconnect geometry in said preferred direction separated by said second interconnect geometry by a different color interconnect geometry design rule space;
    drawing a color cover over said third geometry;
    drawing additional DPT compatible interconnect geometries on said interconnect level using a double pattern technology ("DPT") compatible electronic design automation ("EDA") software program to complete layout of said interconnect level;
    using software program to decompose autorouted metal of said interconnect level into a first color DPT interconnect pattern and a second color DPT interconnect pattern; and
    using said software program to assign said first color to said first and said second interconnect geometries and to assign said second color to said third interconnect geometry underlying said color cover.

2. The process of claim 1 further comprising the steps:
    making a first DPT compatible mask with said first color DPT interconnect pattern;
    making a second DPT compatible mask with said second color geometry DPT interconnect pattern;
    during manufacture of said integrated circuit printing a first DPT compatible interconnect pattern using said first DPT compatible mask in photoresist;
    during manufacture of said integrated circuit printing a second DPT compatible interconnect pattern using said second DPT compatible mask in said photoresist;
    etching said first DPT compatible interconnect pattern and said second DPT compatible interconnect pattern into a dielectric layer to form DPT compatible interconnect trenches; and
    filling said DPT compatible interconnect trenches with metal to form a DPT compatible interconnect.

3. The process of claim 1 further comprising the steps:
    importing an EDA routing program into a workstation; and
    importing a reduced DPT compatible design into said workstation to form said DPT compatible routing program.

4. The process of claim 3 where said reduced set of DPT compatible design rules further comprises:
    a preferred routing direction is defined with alternating color minimum pitch routing in a non preferred direction;
    routing ends are allowed only in said preferred routing direction;
    a preferred direction minimum design rule space for same color geometries is greater than about 2 times the minimum width of geometry immediately adjacent;
    a preferred direction minimum design rule space for different color geometries is less than about 2 times the minimum width of geometry immediately adjacent;
    a non preferred direction minimum interconnect geometry space is larger than a preferred direction minimum interconnect geometry space; and
    a non preferred direction minimum interconnect geometry width is larger than a preferred direction minimum interconnect geometry width.

5. The process of claim 1 where said drawing steps are performed manually.

6. The process of claim 1 where said drawing steps are performed using software.

7. A process of forming an integrated circuit, comprising the steps:
    selecting an interconnect layer from said integrated circuit;
    defining a preferred direction for said interconnect geometries in said interconnect level;
    drawing a first interconnect geometry and second interconnect geometry separated in said preferred direction by a same color interconnect geometry design rule space;
    drawing a third interconnect geometry in said preferred direction separated by said second interconnect geometry by a different color interconnect geometry design rule space;
    drawing a color cover over said third geometry;
    operating a computer system further comprising the steps of:
    loading an electronic design automation ("EDA") routing program into said computer system;
    loading a reduced double pattern technology ("DPT") compatible design rule set into said computer system where said EDA routing program utilizes said DPT compatible design rule set to become a DPT compatible routing program;
    loading color cover design rules into said computer system; and
    drawing autorouted DPT compatible interconnect geometries on said interconnect layer to complete routing said interconnect layer;
    operating said computer system further comprising the steps of:
        loading DPT decomposition software into said computer system;
        decomposing said autorouted DPT compatible interconnect geometies into a first DPT interconnect pattern with first color geometries and into a second DPT interconnect pattern with second color geometries;
        assigning said first color to said first and said second interconnect geometries and adding them to said first DPT pattern; and
        assigning said second color to said third interconnect geometry and adding it to said second DPT pattern.

8. The process of claim 7 further comprising the steps:
    generating a first DPT photomask using said first DPT interconnect pattern;
    generating a second DPT photomask using said second DPT interconnect pattern;
    printing a first pattern in photoresist over a dielectric layer using said first DPT photomask;
    printing a second pattern in photoresist over said dielectric layer using said second DPT photomask;

etching trenches for said first pattern and for said second pattern in said dielectric layer to form interconnect trenches for said interconnect level of interest; and filling said interconnect trenches with metal forming interconnect leads for said interconnect level of interest in said integrated circuit.

9. The process of claim 1 where a width of said color cover in said non preferred direction prevents another geometry from being drawn closer than the non preferred same interconnect geometry design rule space.

10. The process of claim 1 where said color cover is drawn within a repetitive subcircuit.

11. The process of claim 1 where said color cover is drawn within a cell from a cell library.

12. The process of claim 1 where said color cover is drawn within a memory cell.

* * * * *